US012680158B2

(12) United States Patent (10) Patent No.: US 12,680,158 B2
Yu et al. (45) **Date of Patent: \*Jul. 14, 2026**

(54) SELECTIVE COBALT DEPOSITION ON COPPER SURFACES

(71) Applicant: Applied Materials, Inc., Santa Clara, CA (US)

(72) Inventors: Sang-Ho Yu, Cupertino, CA (US); Kevin Moraes, Mountain View, CA (US); Seshadri Ganguli, Sunnyvale, CA (US); Hua Chung, San Jose, CA (US); See-Eng Phan, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 124 days.

This patent is subject to a terminal disclaimer.

(21) Appl. No.: 18/608,005

(22) Filed: Mar. 18, 2024

(65) Prior Publication Data

US 2024/0218503 A1 Jul. 4, 2024

Related U.S. Application Data

(63) Continuation of application No. 17/834,633, filed on Jun. 7, 2022, now Pat. No. 11,959,167, which is a
(Continued)

(51) Int. Cl.
*C23C 16/16* (2006.01)
*C23C 16/02* (2006.01)
(Continued)

(52) U.S. Cl.
CPC .......... *C23C 16/16* (2013.01); *C23C 16/0218* (2013.01); *C23C 16/0245* (2013.01);
(Continued)

(58) Field of Classification Search
CPC . C23C 16/16; C23C 16/0218; C23C 16/0245; C23C 16/18; C23C 16/4554;
(Continued)

(56) References Cited

U.S. PATENT DOCUMENTS 6,203,613 B1 3/2001 Gates et al.
6,294,836 B1 9/2001 Paranjpe et al.
(Continued)

FOREIGN PATENT DOCUMENTS

CN 1921102 A 2/2007
JP 2001203201 A 7/2001
(Continued)

OTHER PUBLICATIONS

Japanese Office Action for Japanese Application No. 2011-507595 dated Dec. 24, 2014.
(Continued)

*Primary Examiner* — Robert S Walters, Jr.
(74) *Attorney, Agent, or Firm* — Patterson + Sheridan, LLP

(57) ABSTRACT

Embodiments of the invention provide processes to selectively form a cobalt layer on a copper surface over exposed dielectric surfaces. In one embodiment, a method for capping a copper surface on a substrate is provided which includes positioning a substrate within a processing chamber, wherein the substrate contains a contaminated copper surface and a dielectric surface, exposing the contaminated copper surface to a reducing agent while forming a copper surface during a pre-treatment process, exposing the substrate to a cobalt precursor gas to selectively form a cobalt capping layer over the copper surface while leaving exposed the dielectric surface during a vapor deposition process, and depositing a dielectric barrier layer over the cobalt capping layer and the dielectric surface. In another embodiment, a (Continued)

deposition-treatment cycle includes performing the vapor deposition process and subsequently a post-treatment process, which deposition-treatment cycle may be repeated to form multiple cobalt capping layers.

20 Claims, 3 Drawing Sheets

Related U.S. Application Data continuation of application No. 15/598,687, filed on May 18, 2017, now Pat. No. 11,384,429, which is a continuation of application No. 14/682,218, filed on Apr. 9, 2015, now abandoned, which is a continuation of application No. 12/111,921, filed on Apr. 29, 2008, now abandoned.

(51) Int. Cl.

| | |
|---|---|
| *C23C 16/18* | (2006.01) |
| *C23C 16/455* | (2006.01) |
| *C23C 16/50* | (2006.01) |
| *H10P 14/43* | (2026.01) |
| *H10P 14/44* | (2026.01) |
| *H10P 70/00* | (2026.01) |
| *H10P 95/90* | (2026.01) |
| *H10W 20/00* | (2026.01) |

(52) U.S. Cl.

CPC .......... *C23C 16/18* (2013.01); *C23C 16/4554* (2013.01); *C23C 16/45542* (2013.01); *C23C 16/50* (2013.01); *H10P 14/43* (2026.01); *H10P 14/432* (2026.01); *H10P 14/44* (2026.01); *H10P 70/27* (2026.01); *H10P 70/277* (2026.01); *H10P 95/90* (2026.01); *H10W 20/037* (2026.01); *H10W 20/038* (2026.01); *H10W 20/0523* (2026.01); *H10W 20/056* (2026.01)

(58) Field of Classification Search

CPC ... C23C 16/45542; C23C 16/50; H10P 95/90; H10P 70/277; H10P 14/43; H10P 14/44; H10P 14/432; H10P 70/27; H10W 20/0523; H10W 20/037; H10W 20/056; H10W 20/038

See application file for complete search history.

(56) References Cited

U.S. PATENT DOCUMENTS

| | | | |
|---|---|---|---|
| 6,346,477 B1 | 2/2002 | Kaloyeros et al. |
| 6,365,502 B1 | 4/2002 | Paranjpe et al. |
| 6,399,489 B1 | 6/2002 | M'Saad et al. |
| 6,444,263 B1 | 9/2002 | Paranjpe et al. |
| 6,527,855 B2 | 3/2003 | DelaRosa et al. |
| 6,528,409 B1 | 3/2003 | Lopatin et al. |
| 6,627,995 B2 | 9/2003 | Paranjpe et al. |
| 6,645,847 B2 | 11/2003 | Paranjpe et al. |
| 6,740,585 B2 | 5/2004 | Yoon et al. |
| 6,812,126 B1 | 11/2004 | Paranjpe et al. |
| 6,861,356 B2 | 3/2005 | Matsuse et al. |
| 6,936,528 B2 | 8/2005 | Koo et al. |
| 7,067,407 B2 | 6/2006 | Kostamo et al. |
| 7,211,506 B2 | 5/2007 | Moon et al. |
| 7,265,048 B2 | 9/2007 | Chung et al. |
| 7,446,032 B2 | 11/2008 | Kailasam |
| 7,473,634 B2 | 1/2009 | Suzuki |
| 7,648,899 B1 | 1/2010 | Banerji et al. |
| 7,955,979 B2 | 6/2011 | Kostamo et al. |
| 11,384,429 B2 | 7/2022 | Yu et al. |
| 2002/0004293 A1 | 1/2002 | Soininen et al. |
| 2002/0076837 A1 | 6/2002 | Hujanen et al. |
| 2002/0081381 A1 | 6/2002 | DelaRosa et al. |
| 2002/0197856 A1 | 12/2002 | Matsuse et al. |
| 2003/0001240 A1 | 1/2003 | Whitehair et al. |
| 2003/0022487 A1 | 1/2003 | Yoon et al. |
| 2003/0029715 A1 | 2/2003 | Yu et al. |
| 2003/0089928 A1 | 5/2003 | Saito et al. |
| 2004/0005753 A1 | 1/2004 | Kostamo et al. |
| 2004/0077158 A1 | 4/2004 | Um et al. |
| 2004/0105934 A1 | 6/2004 | Chang et al. |
| 2004/0203233 A1 | 10/2004 | Kang et al. |
| 2004/0211665 A1 | 10/2004 | Yoon et al. |
| 2004/0241321 A1 | 12/2004 | Ganguli et al. |
| 2005/0085031 A1 | 4/2005 | Lopatin et al. |
| 2005/0124154 A1 | 6/2005 | Park et al. |
| 2005/0164497 A1 | 7/2005 | Lopatin et al. |
| 2005/0196960 A1 | 9/2005 | Koo et al. |
| 2005/0208754 A1 | 9/2005 | Kostamo et al. |
| 2005/0220998 A1 | 10/2005 | Chang et al. |
| 2006/0153973 A1 | 7/2006 | Chang et al. |
| 2006/0199372 A1 | 9/2006 | Chung et al. |
| 2006/0276020 A1 | 12/2006 | Yoon et al. |
| 2007/0048991 A1 | 3/2007 | Shih et al. |
| 2007/0099417 A1 | 5/2007 | Fang et al. |
| 2007/0119370 A1 | 5/2007 | Ma et al. |
| 2007/0119371 A1 | 5/2007 | Ma et al. |
| 2007/0128862 A1 | 6/2007 | Ma et al. |
| 2007/0128863 A1 | 6/2007 | Ma et al. |
| 2007/0128864 A1 | 6/2007 | Ma et al. |
| 2007/0184655 A1 | 8/2007 | Learn et al. |
| 2007/0184656 A1 | 8/2007 | Sherman et al. |
| 2007/0202254 A1 | 8/2007 | Ganguli et al. |
| 2007/0292604 A1 | 12/2007 | Dordi et al. |
| 2007/0292615 A1 | 12/2007 | Dordi et al. |
| 2008/0057221 A1 | 3/2008 | Boyd et al. |
| 2008/0135914 A1 | 6/2008 | Krishna et al. |
| 2008/0268635 A1 | 10/2008 | Yu et al. |
| 2009/0004850 A1 | 1/2009 | Ganguli et al. |
| 2009/0134521 A1 | 5/2009 | Liu et al. |
| 2016/0133563 A1 | 5/2016 | Al et al. |
| 2022/0298625 A1 | 9/2022 | Yu et al. |

FOREIGN PATENT DOCUMENTS

| | | | |
|---|---|---|---|
| JP | 2004-146516 A | 5/2004 |
| JP | 2006506806 A | 2/2006 |
| JP | 2009-533877 A | 9/2009 |
| JP | 2010-503205 A | 1/2010 |
| KR | 10-2004-0039591 | 5/2004 |
| KR | 10-2007-0045986 A | 5/2007 |
| TW | 559933 B | 11/2003 |
| TW | 200419642 A | 10/2004 |
| TW | 200704794 A | 2/2007 |
| WO | 2004044978 A1 | 5/2004 |
| WO | 2007121249 A2 | 10/2007 |
| WO | 2008027216 A2 | 3/2008 |

OTHER PUBLICATIONS

Summary of Official Letter and Search Report mailed Dec. 13, 2013 in for Taiwanese Application No. 98114236.

Notice of Reasons for Rejection dated Nov. 12, 2013 for Japanese Patent Application No. 2011-507595.

Concise Summary of Reasons for Rejection dated Nov. 12, 2013 for Japanese Patent Application No. 2011-507595.

International Search Report and Written Opinion dated Nov. 27, 2009 for International Application No. PCT/US2009/042030.

Dormans, et al. "OMCVD of cobalt and cobalt silicide," Journal of Crystal Growth 114, (1991 ), Elsevier Publishers B. V., DD. 364-372.

Froment, et al. "Nickel vs. Cobalt silicide integration for sub-50-nm CMOS," European Solid-State Device Research, 2003. ESSDERC '03. 33rd Conference on Sep. 16-18, 2003, pp. 215-218.

Kim, et al. "Investigation of Chemical Vapor Deposition (CVD)—Derived Cobalt Silicidation for the Improvement of Contact Resistance," Japanese Journal of Applied Physics, vol. 44, No. 6A, 2005, DD. 3828-3831.

(56) References Cited

OTHER PUBLICATIONS

Lavoie, et al. "Effects of Alloying Elements on Cobalt Silicide Formation," NSLS Activity Report, Science Hiohliohts, 2001, DD. 2-16-2-20.

Lavoie, et al. "Nickel silicide technology," Silicide Technol. Intergr. Circuits, 2004, DD. 95-151.

Lee, et al. "Excellent conformal deposition obtained of pure Co Films by MOCVD using Co2(CO)s as a Co precursor," http:/www. samsung.com/AboutSAMSUNG. ELECTRONICSGLOBAUSocialCommitment/Humantech These/ WinninoPapers/downloads/11th/silverproze/LeeJeongGil.pdf.

Lim, et al. "Atomic layer deposition of transition metals," Nature Materials, vol. 2, Nov. 2003, DD. 749-754.

Yun, et al. "Highly Scalable PVD/CVD-Cobalt Bilayer Salicidation Technology for sub-50nm CMOSFETs," 20?1h ECS Meetina— Quebec City, Canada, May 15-20, 2005.

Office Action for Korean Application No. 10-2010-7026817 dated Dec. 3, 2015.

Office Action for U.S. Appl. No. 12/111,921 dated Jun. 13, 2011.

Final Office Action for U.S. Appl. No. 12/111,921 dated Dec. 21, 2011.

Office Action for Korean Application No. 10-2010-7026817 dated May 8, 2015.

Office Action and Search Report for Taiwan Application No. 103116576 dated Apr. 13, 2015.

Julius Grant, editor; Hackh's Chemical Dictionary; 3rd edition; McGraw-Hillbrook Company, incorporated, New York; 1944 (no month), excerpt p. 259.

Office Action for Korean Application No. 10-2017-7033840 dated Jan. 24, 2018.

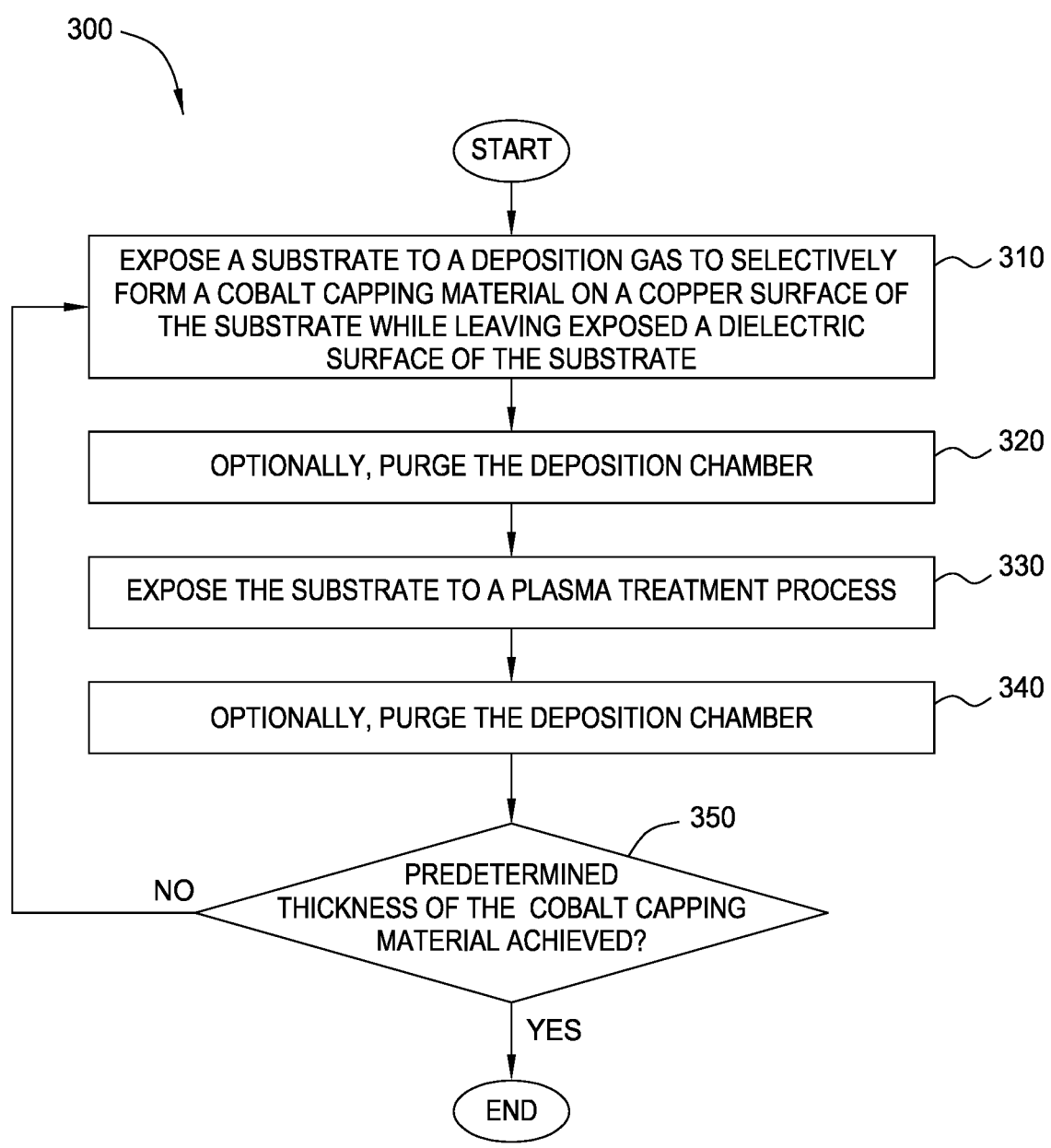

300

START

EXPOSE A SUBSTRATE TO A DEPOSITION GAS TO SELECTIVELY FORM A COBALT CAPPING MATERIAL ON A COPPER SURFACE OF THE SUBSTRATE WHILE LEAVING EXPOSED A DIELECTRIC SURFACE OF THE SUBSTRATE — 310

OPTIONALLY, PURGE THE DEPOSITION CHAMBER — 320

EXPOSE THE SUBSTRATE TO A PLASMA TREATMENT PROCESS — 330

OPTIONALLY, PURGE THE DEPOSITION CHAMBER — 340

350

PREDETERMINED THICKNESS OF THE COBALT CAPPING MATERIAL ACHIEVED?

NO

YES

END

FIG. 3

SELECTIVE COBALT DEPOSITION ON COPPER SURFACES

CROSS-REFERENCE TO RELATED APPLICATIONS

This application is a continuation of U.S. application Ser. No. 17/834,633, filed Jun. 7, 2022, which is a continuation of U.S. application Ser. No. 15/598,687, filed May 18, 2017, and issued as U.S. Pat. No. 11,384,429, which is a continuation of U.S. application Ser. No. 14/682,218, filed Apr. 9, 2015, now abandoned, which is a continuation of U.S. application Ser. No. 12/111,921, filed Apr. 29, 2008, now abandoned, which are all herein incorporated by reference in their entirety.

BACKGROUND

Field

Embodiments of the invention generally relate to a metallization process for manufacturing semiconductor devices, more particularly, embodiments relate to preventing copper dewetting by depositing cobalt materials on a substrate.

Description of the Related Art

Copper is the current metal of choice for use in multilevel metallization processes that are crucial to semiconductor device manufacturing. The multilevel interconnects that drive the manufacturing processes require planarization of high aspect ratio apertures including contacts, vias, lines, and other features. Filling the features without creating voids or deforming the feature geometry is more difficult when the features have higher aspect ratios. Reliable formation of interconnects is also more difficult as manufacturers strive to increase circuit density and quality.

As the use of copper has permeated the marketplace because of its relative low cost and processing properties, semiconductor manufacturers continue to look for ways to improve the boundary regions between copper and dielectric material by reducing copper diffusion and dewetting. Several processing methods have been developed to manufacture copper interconnects as feature sizes have decreased. Each processing method may increase the likelihood of errors such as copper diffusion across boundary regions, copper crystalline structure deformation, and dewetting. Physical vapor deposition (PVD), chemical vapor deposition (CVD), atomic layer deposition (ALD), chemical mechanical polishing (CMP), electrochemical plating (ECP), electrochemical mechanical polishing (ECMP), and other methods of depositing and removing copper layers utilize mechanical, electrical, or chemical methods to manipulate the copper that forms the interconnects. Barrier and capping layers may be deposited to contain the copper.

In the past, a layer of tantalum, tantalum nitride, or copper alloy with tin, aluminum, or magnesium was used to provide a barrier layer or an adhesion promoter between copper and other materials. These options are costly or only partially effective or both. As the copper atoms along the boundary regions experience changes in temperature, pressure, atmospheric conditions, or other process variables common during multiple step semiconductor processing, the copper may migrate along the boundary regions and become agglomerated copper. The copper may also be less uniformly dispersed along the boundary regions and become dewetted copper. These changes in the boundary region include stress migration and electromigration of the copper atoms. The stress migration and electromigration of copper across the dielectric layers or other structures increases the resistivity of the resulting structures and reduces the reliability of the resulting devices.

Barrier layers containing cobalt have been deposited by PVD, CVD, and ALD processes. PVD processes to deposit cobalt are often hard to control precise deposition thicknesses. CVD processes usually suffer from poor conformality and contaminants in the deposited cobalt layer. During a typical ALD process, a cobalt precursor and a reducing agent are sequentially exposed to a substrate to form the desired cobalt layer. ALD processes have several advantages over other vapor deposition processes, such as very conformal films and the ability to deposit into high aspect ratio vias. However, the deposition rates of an ALD process are often too slow, so that ALD processes are not often used in commercial applications.

Therefore, a need exists to enhance the stability and adhesion of copper-containing layers, especially for copper seed layers. Also, a need exists to improve the electromigration (EM) reliability of copper-containing layer, especially for copper line formations, while preventing the diffusion of copper into neighboring materials, such as dielectric materials. A further need exists for an improved vapor deposition process to deposit cobalt materials.

SUMMARY OF THE INVENTION

Embodiments of the invention provide processes to selectively form a cobalt layer on a copper surface over exposed dielectric surfaces. In one embodiment, a method for capping a copper surface on a substrate is provided which includes positioning a substrate within a processing chamber, wherein the substrate contains a contaminated copper surface and a dielectric surface, exposing the contaminated copper surface to a reducing agent while forming a metallic copper surface during a pre-treatment process, exposing the substrate to a cobalt precursor gas to selectively form a cobalt capping layer over the metallic copper surface while leaving exposed the dielectric surface during a vapor deposition process, and depositing a dielectric barrier layer over the cobalt capping layer and the dielectric surface.

In some examples, the method further includes chemically reducing copper oxides on the contaminated copper surface to form the metallic copper surface during the pre-treatment process. The contaminated copper surface may be exposed to the reducing agent and a plasma is ignited during the pre-treatment process, the reducing agent may contain a reagent such as nitrogen ($N_2$), ammonia ($NH_3$), hydrogen ($H_2$), an ammonia/nitrogen mixture, or combinations thereof. In some examples, the contaminated copper surface may be exposed to the plasma for a time period within a range from about 5 seconds to about 15 seconds. In another example, the reducing agent contains hydrogen gas, the pre-treatment process is a thermal process, and the substrate is heated to a temperature within a range from about 200° C. to about 400° C. during the thermal process.

In other examples, the method further includes exposing the cobalt capping layer to a reagent and a plasma during a post-treatment process prior to depositing the dielectric barrier layer. The reagent may contain nitrogen, ammonia, hydrogen, an ammonia/nitrogen mixture, or combinations thereof.

In another embodiment, a deposition-treatment cycle includes performing the vapor deposition process and subsequently the post-treatment process, and the deposition-treatment cycle is performed 2, 3, or more times to deposit multiple cobalt capping layers. Each of the cobalt capping layers may be deposited to a thickness within a range from about 3 Å to about 5 Å during each of the deposition-treatment cycles. The overall cobalt capping material or cobalt capping layer may have a thickness within a range from about 4 Å to about 20 Å. In some examples, the cobalt capping layer has a thickness of less than about 10 Å.

The substrate may be exposed to a deposition gas containing the cobalt precursor gas and hydrogen gas during the vapor deposition process, the vapor deposition process is a thermal chemical vapor deposition process or an atomic layer deposition process. wherein the cobalt precursor gas contains a cobalt precursor which has the general chemical formula $(CO)_xCo_yL_z$, wherein X is 1, 2, 3, 4, 5, 6, 7, 8, 9, 10, 11, or 12; Y is 1, 2, 3, 4, or 5; Z is 1, 2, 3, 4, 5, 6, 7, or 8; and L is a ligand independently selected from cyclopentadienyl, alkylcyclopentadienyl, methylcyclopentadienyl, pentamethylcyclopentadienyl, pentadienyl, alkylpentadienyl, cyclobutadienyl, butadienyl, allyl, ethylene, propylene, alkenes, dialkenes, alkynes, nitrosyl, ammonia, derivatives thereof, or combinations thereof. The cobalt precursor gas may contain a cobalt precursor selected from the group consisting of tricarbonyl allyl cobalt, cyclopentadienyl cobalt bis(carbonyl), methylcyclopentadienyl cobalt bis(carbonyl), ethylcyclopentadienyl cobalt bis(carbonyl), pentamethylcyclopentadienyl cobalt bis(carbonyl), dicobalt octa (carbonyl), nitrosyl cobalt tris(carbonyl), bis (cyclopentadienyl) cobalt, (cyclopentadienyl) cobalt (cyclohexadienyl), cyclopentadienyl cobalt (1,3-hexadienyl), (cyclobutadienyl) cobalt (cyclopentadienyl), bis(methylcyclopentadienyl) cobalt, (cyclopentadienyl) cobalt (5-methylcyclopentadienyl), bis(ethylene) cobalt (pentamethylcyclopentadienyl), derivatives thereof, complexes thereof, plasmas thereof, or combinations thereof. In one example, the cobalt precursor contains cyclopentadienyl cobalt bis(carbonyl).

In another embodiment, a method for capping a copper surface on a substrate is provided which includes positioning a substrate within a processing chamber, wherein the substrate contains a copper oxide surface and a dielectric surface, exposing the copper oxide surface to an ammonia plasma or a hydrogen plasma while forming a metallic copper surface during a pre-treatment process, exposing the substrate to a cobalt precursor gas to selectively form a cobalt capping layer over the metallic copper surface while leaving exposed the dielectric surface during a vapor deposition process, exposing the cobalt capping layer to a plasma during a post-treatment process, and depositing a dielectric barrier layer over the cobalt capping layer and the dielectric surface.

In some examples, a deposition-treatment cycle is formed by performing the vapor deposition process and subsequently the post-treatment process. The deposition-treatment cycle may be performed 2, 3, or more times to deposit multiple cobalt capping layers. Each of the cobalt capping layers may be deposited to a thickness within a range from about 3 Å to about 5 Å during each of the deposition-treatment cycles.

In another example, the copper oxide surface may be exposed to the ammonia plasma or the hydrogen plasma for a time period within a range from about 5 seconds to about 15 seconds during a pre-treatment process. The plasma may be exposed to the cobalt capping layer during the post-treatment process contains nitrogen, ammonia, an ammonia/nitrogen mixture, or hydrogen.

In another embodiment, a method for capping a copper surface on a substrate is provided which includes positioning a substrate within a processing chamber, wherein the substrate contains a copper oxide surface and a dielectric surface, exposing the copper oxide surface to an ammonia plasma or a hydrogen plasma while forming a metallic copper surface during a pre-treatment process, exposing the substrate to a cobalt precursor gas and hydrogen gas to selectively form a cobalt capping layer over the metallic copper surface while leaving exposed the dielectric surface during a vapor deposition process, and exposing the cobalt capping layer to a plasma and a reagent selected from the group consisting of nitrogen, ammonia, hydrogen, an ammonia/nitrogen mixture, and combinations thereof during a post-treatment process.

In another embodiment, a method for capping a copper surface on a substrate is provided which includes positioning a substrate within a processing chamber, wherein the substrate contains a contaminated copper surface and a dielectric surface, exposing the contaminated copper surface to a reducing agent while forming a metallic copper surface during a pre-treatment process, and depositing a cobalt capping material over the metallic copper surface while leaving exposed the dielectric surface during a deposition-treatment cycle. In one example, the deposition-treatment cycle includes exposing the substrate to a cobalt precursor gas to selectively form a first cobalt layer over the metallic copper surface while leaving exposed the dielectric surface during a vapor deposition process, exposing the first cobalt layer to a plasma containing nitrogen, ammonia, an ammonia/nitrogen mixture, or hydrogen during a treatment process, exposing the substrate to the cobalt precursor gas to selectively form a second cobalt layer over the first cobalt layer while leaving exposed the dielectric surface during the vapor deposition process, and exposing the second cobalt layer to the plasma during the treatment process. The method further provides depositing a dielectric barrier layer over the cobalt capping material and the dielectric surface.

In some examples, the method provides exposing the substrate to the cobalt precursor gas to selectively form a third cobalt layer over the second cobalt layer while leaving exposed the dielectric surface during the vapor deposition process, and exposing the third cobalt layer to the plasma during the treatment process.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3 depicts a flow chart illustrating a deposition process according to another embodiment described herein.

DETAILED DESCRIPTION

Embodiments of the invention provide a method that utilizes a cobalt capping layer or material to prevent copper diffusion and dewetting in interconnect boundary regions. The transition metal, for example, cobalt, improves copper boundary region properties to promote adhesion, decrease diffusion and agglomeration, and encourage uniform roughness and wetting of the substrate surface during processing. Embodiments provide that a cobalt capping layer may be selectively deposited on a copper contact or surface on a substrate while leaving exposed dielectric surfaces on the substrate.

Figure 1:
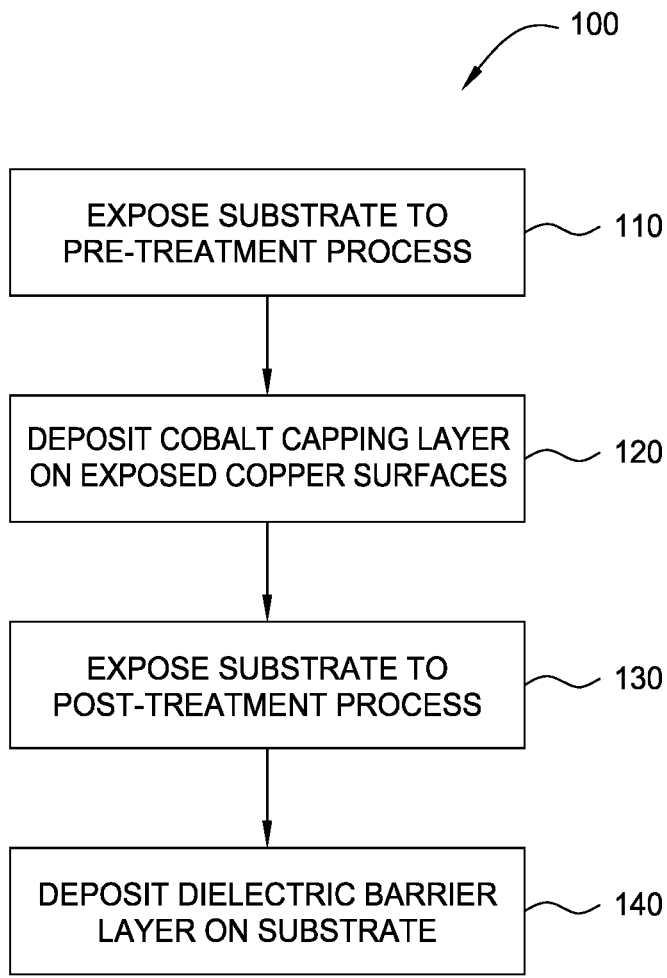
FIG. 1 depicts a flow chart illustrating a treatment and deposition process according to an embodiment described herein.

FIG. 1 depicts a flow chart illustrating process 100 according to an embodiment of the invention. Process 100 may be used to clean and cap a copper contact surface on a substrate post a polishing process. In one embodiment, steps 110-140 of process 100 may be used on substrate 200, depicted in FIGS. 2A-2E. Process 100 includes exposing a substrate to pre-treatment process (step 110), depositing a cobalt capping layer on exposed copper surfaces of the substrate (step 120), exposing the substrate to post-treatment process (step 130), and depositing a dielectric barrier layer on the substrate (step 140).

Figures 2A, 2B, 2C, 2D, 2E:
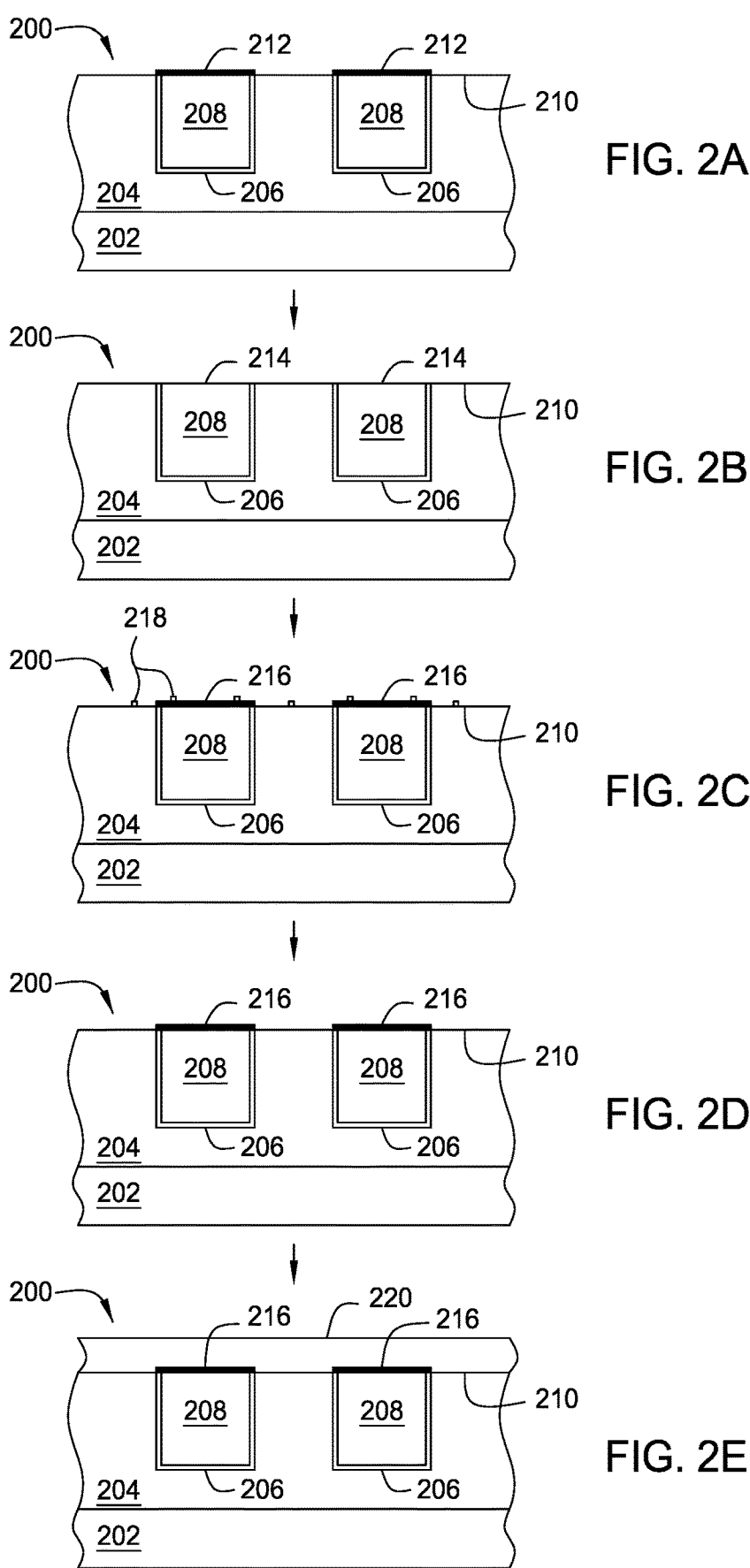
FIGS. 2A-2E depict schematic views of a substrate at different process steps according to an embodiment described herein.

FIG. 2A depicts substrate 200 containing dielectric layer 204 disposed over underlayer 202 after being exposed to a polishing process. Copper contacts 208 are disposed within dielectric layer 204 and are separated from dielectric layer 204 by barrier layer 206. Dielectric layer 204 contains a dielectric material, such as a low-k dielectric material. In one example, dielectric layer 204 contains a low-k dielectric material, such as a silicon carbide oxide material or a carbon doped silicon oxide material, for example, BLACK DIA-MOND® II low-k dielectric material, available from Applied Materials, Inc., located in Santa Clara, California.

Barrier layer 206 may be conformally deposited into the aperture within dielectric layer 204. Barrier layer 206 may be formed or deposited by a PVD process, an ALD, or a CVD process, and may have a thickness within a range from about 5 Å to about 50 Å, preferably, from about 10 Å to about 30 Å. Barrier layer 206 may contain titanium, titanium nitride, tantalum, tantalum nitride, tungsten, tungsten nitride, silicides thereof, derivatives thereof, or combinations thereof. In some embodiments, barrier layer 206 may contain a tantalum/tantalum nitride bilayer or titanium/ titanium nitride bilayer. In one example, barrier layer 206 contains tantalum nitride and metallic tantalum layers deposited by PVD processes.

During the polishing process, such as a chemical mechanical polishing (CMP) process, the upper surface of copper contacts 208 are exposed across substrate field 210 and contaminants 212 are formed on copper contacts 212. Contaminants 212 usually contain copper oxides formed during or after the polishing process. The exposed surfaces of copper contacts 208 may be oxidized by peroxides, water, or other reagents in the polishing solution or by oxygen within the ambient air. Contaminants 212 may also include moisture, polishing solution remnants including surfactants and other additives, or particles of polished away materials.

At step 110 of process 100, contaminants 212 may be removed from substrate field 210 by exposing substrate 200 to a pre-treatment process. Copper surfaces 214 are exposed once contaminants 212 are treated or removed from copper contacts 208, as illustrated in FIG. 2B. Copper oxides may be chemically reduced by exposing substrate 200 to a reducing agent. The pre-treatment process exposes substrate 200 to the reducing agent during a thermal process or a plasma process. The reducing agent may have a liquid state, a gas state, a plasma state, or combinations thereof. Reducing agent that are useful during the pre-treatment process include hydrogen (e.g., $H_2$ or atomic-H), ammonia ($NH_3$), a hydrogen and ammonia mixture ($H_2/NH_3$), atomic-N, hydrazine ($N_2H_4$), alcohols (e.g., methanol, ethanol, or propanol), derivatives thereof, plasmas thereof, or combinations thereof. Substrate 200 may be exposed to a plasma formed in situ or remotely during the pre-treatment process.

In one embodiment, substrate 200 is exposed to a thermal pre-treatment process to remove contaminants 212 from copper contacts 208 while forming copper surfaces 214. Substrate 200 may be positioned within a processing chamber, exposed to a reducing agent, and heated to a temperature within a range from about 200° C. to about 800° C., preferably, from about 250° C. to about 600° C., and more preferably, from about 300° C. to about 500° C. Substrate 200 may be heated for a time period within a range from about 2 minutes to about 20 minutes, preferably, from about 5 minutes to about 15 minutes. For example, substrate 200 may be heated to about 500° C. in a processing chamber containing a hydrogen atmosphere for about 12 minutes.

In another embodiment, substrate 200 is exposed to a plasma pre-treatment process to remove contaminants 212 from copper contacts 208 while forming copper surfaces 214. Substrate 200 may be positioned within a processing chamber, exposed to a reducing agent, and heated to a temperature within a range from about 100° C. to about 400° C., preferably, from about 125° C. to about 350° C., and more preferably, from about 150° C. to about 300° C., such as about 200° C. or about 250° C. The processing chamber may produce an in situ plasma or be equipped with a remote plasma source (RPS). In one embodiment, substrate 200 may be exposed to the plasma (e.g., in situ or remotely) for a time period within a range from about 2 seconds to about 60 seconds, preferably, from about 3 seconds to about 30 seconds, preferably, from about 5 seconds to about 15 seconds, such as about 10 seconds. The plasma may be produced at a power within the range from about 200 watts to about 1,000 watts, preferably, from about 400 watts to about 800 watts. In one example, substrate 200 may be exposed to hydrogen gas while a plasma is generated at 400 watts for about 10 seconds at about 5 Torr. In another example, substrate 200 may be exposed to ammonia gas while a plasma is generated at 800 watts for about 20 seconds at about 5 Torr. In another example, substrate 200 may be exposed to a hydrogen and ammonia gaseous mixture while a plasma is generated at 400 watts for about 15 seconds at about 5 Torr.

At step 120 of process 100, cobalt capping layer 216 may be selectively deposited or formed on copper surfaces 214 while leaving bare the exposed surfaces of dielectric layer 204 across substrate field 210, as illustrated in FIG. 2C. Therefore, along substrate field 210, cobalt capping layer 216 is selectively deposited on copper surfaces 214 while leaving the surfaces of dielectric layer 204 free or at least substantially free of cobalt capping layer 216. Initially, cobalt capping layer 216 may be a continuous layer or a discontinuous layer across copper surfaces 214, but is a continuous layer after multiple deposition cycles.

Contaminants 218 may collect throughout substrate field 210, such as on cobalt capping layer 216 as well as the surfaces of dielectric layer 204, as depicted in FIG. 2C. Contaminants 218 may include by-products from the deposition process, such as carbon, organic residue, precursor residue, and other undesirable materials collected on substrate field 210.

Substrate 200 may be exposed to a plasma formed in situ or remotely during the post-treatment process at step 130 of process 100. The post-treatment process removes or reduces the amount of contaminants from substrate 200 while further densifying cobalt capping layer 216. The post-treatment process may expose substrate 200 and cobalt capping layer 216 to a reducing agent during the plasma process. Reducing agent that are useful during the post-treatment process include hydrogen (e.g., $H_2$ or atomic-H), ammonia ($NH_3$), a hydrogen and ammonia mixture ($H_2/NH_3$), nitrogen (e.g., $N_2$ or atomic-N), hydrazine ($N_2H_4$), derivatives thereof, plasmas thereof, or combinations thereof. Cobalt capping layer 216 may be exposed to the plasma during the post-treatment process for a time period within a range from about 2 seconds to about 60 seconds, preferably, from about 3 seconds to about 30 seconds, and more preferably, from about 5 seconds to about 15 seconds.

In one example, the cobalt capping layer is exposed to a hydrogen plasma, formed by igniting hydrogen gas in situ or remotely of the processing chamber. In another example, the cobalt capping layer is exposed to an ammonia plasma, formed by igniting ammonia gas in situ or remotely of the processing chamber. In another example, the cobalt capping layer is exposed to a hydrogen/ammonia plasma, formed by igniting a mixture of hydrogen gas and ammonia gas in situ or remotely of the processing chamber.

A plasma may be generated external from the processing chamber, such as by a remote plasma source (RPS) system, or preferably, the plasma may be generated in situ a plasma capable deposition chamber, such as a PE-CVD chamber during a plasma treatment process, such as in steps 130 or 330. The plasma may be generated from a microwave (MW) frequency generator or a radio frequency (RF) generator. In a preferred example, an in situ plasma is generated by a RF generator. The processing chamber may be pressurized during the plasma treatment process at a pressure within a range from about 0.1 Torr to about 80 Torr, preferably from about 0.5 Torr to about 10 Torr, and more preferably, from about 1 Torr to about 5 Torr. Also, the chamber or the substrate may be heated to a temperature of less than about 500° C., preferably within a range from about 100° C. to about 450° C., and more preferably, from about 150° C. to about 400° C., for example, about 300° C.

During treatment processes, a plasma may be ignited within the processing chamber for an in situ plasma process, or alternative, may be formed by an external source, such as a RPS system. The RF generator may be set at a frequency within a range from about 100 kHz to about 60 MHz. In one example, a RF generator, with a frequency of 13.56 MHZ, may be set to have a power output within a range from about 100 watts to about 1,000 watts, preferably, from about 250 watts to about 600 watts, and more preferably, from about 300 watts to about 500 watts. In one example, a RF generator, with a frequency of 350 kHz, may be set to have a power output within a range from about 200 watts to about 2,000 watts, preferably, from about 500 watts to about 1,500 watts, and more preferably, from about 800 watts to about 1,200 watts, for example, about 1,000 watts. A surface of substrate may be exposed to a plasma having a power per surface area value within a range from about 0.01 watts/cm² to about 10.0 watts/cm², preferably, from about 0.05 watts/cm² to about 6.0 watts/cm².

In another embodiment, step 120 is repeated at least once, two times, or more. Step 120 may be performed one time to form a single layer of cobalt capping layer 216, or performed multiple times to form multiple layers of cobalt capping layer 216, such as 2, 3, 4, 5, or more layers of cobalt capping layer 216. In another embodiment, steps 120 and 130 are sequentially repeated at least once, if not, 2, 3, 4 or more times. Cobalt capping layer 216 may be deposited having a thickness within a range from about 2 Å to about 30 Å, preferably, from about 3 Å to about 25 Å, more preferably, from about 4 Å to about 20 Å, and more preferably, from about 5 Å to about 10 Å, such as about 7 Å or about 8 Å. In one example, two cycles of steps 120 and 130 and performed to form cobalt capping layer 216 with a thickness of about 7 Å. In another example, three cycles of steps 120 and 130 and performed to form cobalt capping layer 216 with a thickness of about 8 Å.

Cobalt capping layer 216 may be deposited by thermal decomposition of a cobalt containing precursor carried by an inert gas during step 120. A reducing gas may be co-flowed or alternately pulsed into the processing chamber along with the cobalt precursor. The substrate may be heated to a temperature within a range from about 50° C. to about 600° C., preferably, from about 100° C. to about 500° C., and more preferably, from about 200° C. to about 400° C. Alternatively, cobalt capping layer 216 may be deposited by exposing the substrate to a cobalt containing precursor gas in an ALD or CVD process.

FIG. 3 depicts a flow-chart of process 300 which may be used to form cobalt-containing materials, such as cobalt capping layer 216. In one embodiment, process 300 includes exposing a substrate to a deposition gas to form a cobalt capping material (step 310), optionally purging the deposition chamber (step 320), exposing the substrate to a plasma treatment process (step 330), purging the deposition chamber (step 340), and determining if a predetermined thickness of the cobalt capping material has been formed on the substrate (step 350). In one embodiment, the cycle of steps 310-350 may be repeated if the cobalt capping material has not been formed having the predetermined thickness. In another embodiment, the cycle of steps 310 and 330 may be repeated if the cobalt capping material has not been formed having the predetermined thickness. Alternately, process 300 may be stopped once the cobalt capping material has been formed having the predetermined thickness.

In one embodiment, a method for capping a copper surface on a substrate is provided which includes exposing the substrate to a cobalt precursor gas and hydrogen gas to selectively form a cobalt capping layer over the metallic copper surface while leaving exposed the dielectric surface during a vapor deposition process, and exposing the cobalt capping layer to a plasma and a reagent, such as nitrogen, ammonia, hydrogen, an ammonia/nitrogen mixture, or combinations thereof during a post-treatment process.

In another embodiment, a method for capping a copper surface on a substrate is provided which includes depositing a cobalt capping material over the metallic copper surface while leaving exposed the dielectric surface during a deposition-treatment cycle. In one example, the deposition-treatment cycle includes exposing the substrate to a cobalt precursor gas to selectively form a first cobalt layer over the metallic copper surface while leaving exposed the dielectric surface during a vapor deposition process, exposing the first cobalt layer to a plasma containing nitrogen, ammonia, an ammonia/nitrogen mixture, or hydrogen during a treatment process. The method further provides exposing the substrate to the cobalt precursor gas to selectively form a second cobalt layer over the first cobalt layer while leaving exposed the dielectric surface during the vapor deposition process, and exposing the second cobalt layer to the plasma during the treatment process.

In some examples, the method provides exposing the substrate to the cobalt precursor gas to selectively form a third cobalt layer over the second cobalt layer while leaving exposed the dielectric surface during the vapor deposition process, and exposing the third cobalt layer to the plasma during the treatment process.

Suitable cobalt precursors for forming cobalt-containing materials (e.g., metallic cobalt or cobalt alloys) by CVD or ALD processes described herein include cobalt carbonyl complexes, cobalt amidinates compounds, cobaltocene compounds, cobalt dienyl complexes, cobalt nitrosyl complexes, derivatives thereof, complexes thereof, plasma thereof, or combinations thereof. In some embodiments, cobalt materials may be deposited by CVD and ALD processes further described in commonly assigned U.S. Pat. Nos. 7,264,846 and 7,404,985, which are herein incorporated by reference.

In some embodiments, cobalt carbonyl compounds or complexes may be utilized as cobalt precursors. Cobalt carbonyl compounds or complexes have the general chemical formula $(CO)_x Co_y L_z$, where X may be 1, 2, 3, 4, 5, 6, 7, 8, 9, 10, 11, or 12, Y may be 1, 2, 3, 4, or 5, and Z may be 1, 2, 3, 4, 5, 6, 7, or 8. The group L is absent, one ligand or multiple ligands, that may be the same ligand or different ligands, and include cyclopentadienyl, alkylcyclopentadienyl (e.g., methylcyclopentadienyl or pentamethylcyclopentadienyl), pentadienyl, alkylpentadienyl, cyclobutadienyl, butadienyl, ethylene, allyl (or propylene), alkenes, dialkenes, alkynes, acetylene, bytylacetylene, nitrosyl, ammonia, derivatives thereof, complexes thereof, plasma thereof, or combinations thereof. Some exemplary cobalt carbonyl complexes include cyclopentadienyl cobalt bis(carbonyl) ($CpCo(CO)_2$), tricarbonyl allyl cobalt ($(CO)_3Co(CH_2CH=CH_2)$), dicobalt hexacarbonyl bytylacetylene (CCTBA, $(CO)_6Co_2(HC\equiv C^tBu)$), dicobalt hexacarbonyl methylbytylacetylene ($(CO)_6Co_2(MeC\equiv C^tBu)$), dicobalt hexacarbonyl phenylacetylene ($(CO)_6Co_2(HC\equiv CPh)$), hexacarbonyl methylphenylacetylene ($(CO)_6Co_2(MeC\equiv CPh)$), dicobalt hexacarbonyl methylacetylene ($(CO)_6Co_2(HC\equiv CMe)$), dicobalt hexacarbonyl dimethylacetylene ($(CO)_6Co_2(MeC\equiv CMe)$), derivatives thereof, complexes thereof, plasma thereof, or combinations thereof.

In another embodiment, cobalt amidinates or cobalt amido complexes may be utilized as cobalt precursors. Cobalt amido complexes have the general chemical formula $(RR'N)_x Co$, where X may be 1, 2, or 3, and R and R' are independently hydrogen, methyl, ethyl, propyl, butyl, alkyl, silyl, alkylsilyl, derivatives thereof, or combinations thereof. Some exemplary cobalt amido complexes include bis(di(butyldimethylsilyl)amido) cobalt ($(((BuMe_2Si)_2N)_2Co)$), bis(di(ethyldimethyl-silyl)amido) cobalt ($(((EtMe_2Si)_2N)_2Co)$), bis(di(propyldimethylsilyl)amido) cobalt ($(((PrMe_2Si)_2N)_2Co)$), bis(di(trimethylsilyl)amido) cobalt ($(((Me_3Si)_2N)_2Co)$), tris(di(trimethylsilyl)amido) cobalt ($(((Me_3Si)_2N)_3Co)$), derivatives thereof, complexes thereof, plasma thereof, or combinations thereof.

Some exemplary cobalt precursors include methylcyclopentadienyl cobalt bis(carbonyl) ($MeCpCo(CO)_2$), ethylcyclopentadienyl cobalt bis(carbonyl) ($EtCpCo(CO)_2$), pentamethylcyclopentadienyl cobalt bis(carbonyl) ($Me_5CpCo(CO)_2$), dicobalt octa(carbonyl) ($CO_2(CO)_8$), nitrosyl cobalt tris(carbonyl) ($(ON)Co(CO)_3$), bis(cyclopentadienyl) cobalt, (cyclopentadienyl) cobalt (cyclohexadienyl), cyclopentadienyl cobalt (1,3-hexadienyl), (cyclobutadienyl) cobalt (cyclopentadienyl), bis(methylcyclopentadienyl) cobalt, (cyclopentadienyl) cobalt (5-methylcyclo-pentadienyl), bis(ethylene) cobalt (pentamethylcyclopentadienyl), cobalt tetracarbonyl iodide, cobalt tetracarbonyl trichlorosilane, carbonyl chloride tris(trimethylphosphine) cobalt, cobalt tricarbonyl-hydrotributylphosphine, acetylene dicobalt hexacarbonyl, acetylene dicobalt pentacarbonyl triethylphosphine, derivatives thereof, complexes thereof, plasma thereof, or combinations thereof.

Suitable reagents, including reducing agents, that are useful to form cobalt-containing materials (e.g., metallic cobalt, cobalt capping layers, or cobalt alloys) by processes described herein include hydrogen (e.g., $H_2$ or atomic-H), atomic-N, ammonia ($NH_3$), hydrazine ($N_2H_4$), a hydrogen and ammonia mixture ($H_2/NH_3$), borane ($BH_3$), diborane ($B_2H_6$), triethylborane ($Et_3B$), silane ($SiH_4$), disilane ($Si_2H_6$), trisilane ($Si_3H_8$), tetrasilane ($Si_4H_{10}$), methyl silane ($SiCH_6$), dimethylsilane ($SiC_2H_8$), phosphine ($PH_3$), derivatives thereof, plasmas thereof, or combinations thereof.

During step 140 of process 100, dielectric barrier layer 220 may be deposited over cobalt capping layer 216 and on substrate 200, as depicted in FIG. 2E. Dielectric barrier layer 220 having a low dielectric constant may be deposited on substrate 200, across substrate field 210, and over cobalt capping layer 216. Dielectric barrier layer 220 may contain a low-k dielectric material, such as silicon carbide, silicon nitride, silicon oxide, silicon oxynitride, silicon carbide oxide or carbon doped silicon oxide material, derivatives thereof, or combinations thereof. In one example, BLOK® low-k dielectric material, available from Applied Materials, Inc., located in Santa Clara, California, may be utilized as a low-k dielectric material for dielectric barrier layer 220. An example of a suitable material for dielectric barrier layer 220 is a silicon carbide based film formed using CVD or plasma enhanced CVD (PE-CVD) processes such as the processes described in commonly assigned U.S. Pat. Nos. 6,537,733, 6,790,788, and 6,890,850, which are herein incorporated by reference.

An ALD processing chamber used during embodiments described herein is available from Applied Materials, Inc., located in Santa Clara, California. A detailed description of an ALD processing chamber may be found in commonly assigned U.S. Pat. Nos. 6,916,398; 6,878,206; 7,682,946; 7,780,785; and 7,850,779, and commonly assigned U.S. Ser. Nos. 11/556,745, 11/556,752, and 11/556,756, each filed Nov. 6, 2006, and each respectively published as U.S. Pub. Nos. 2007-0119370, 2007-0119371, and 2007-0128862, which are hereby incorporated by reference in their entirety. In another embodiment, a chamber configured to operate in both an ALD mode as well as a conventional CVD mode may be used to deposit cobalt-containing materials is described in commonly assigned U.S. Pat. No. 7,204,886, which is incorporated herein by reference in its entirety. A detailed description of an ALD process for forming cobalt-containing materials is further disclosed in commonly assigned U.S. Pat. Nos. 7,264,846 and 7,404,985, which are hereby incorporated by reference in their entirety. In other embodiments, a chamber configured to operate in both an ALD mode as well as a conventional CVD mode that may be used to deposit cobalt-containing materials is the TXZ® showerhead and CVD chamber available from Applied Materials, Inc., located in Santa Clara, California.

"Substrate surface" or "substrate," as used herein, refers to any substrate or material surface formed on a substrate upon which film processing is performed during a fabrication process. For example, a substrate surface on which processing may be performed include materials such as monocrystalline, polycrystalline or amorphous silicon, strained silicon, silicon on insulator (SOI), doped silicon, silicon germanium, germanium, gallium arsenide, glass, sapphire, silicon oxide, silicon nitride, silicon oxynitride, and/or carbon doped silicon oxides, such as $SiO_xC_y$, for example, BLACK DIAMOND® low-k dielectric, available from Applied Materials, Inc., located in Santa Clara, California. Substrates may have various dimensions, such as 200 mm or 300 mm diameter wafers, as well as, rectangular or square panes. Unless otherwise noted, embodiments and examples described herein are preferably conducted on substrates with a 200 mm diameter or a 300 mm diameter, more preferably, a 300 mm diameter. Embodiments of the processes described herein deposit cobalt silicide materials, metallic cobalt materials, and other cobalt-containing materials on many substrates and surfaces, especially, silicon-containing dielectric materials. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, and patterned or non-patterned wafers. Substrates may be exposed to a pre-treatment process to polish, etch, reduce, oxidize, hydroxylate, anneal, and/or bake the substrate surface.

While the foregoing is directed to embodiments of the invention, other and further embodiments of the invention may be devised without departing from the basic scope thereof, and the scope thereof is determined by the claims that follow.

The invention claimed is:

1. A method for capping a copper surface on a substrate, comprising:

positioning a substrate within a processing chamber, wherein the substrate comprises a contaminated copper surface and a dielectric surface;

exposing the contaminated copper surface to a reducing agent while forming a metallic copper surface during a pre-treatment process; and selectively forming a cobalt capping layer on the metallic copper surface while leaving exposed the dielectric surface, comprising:

exposing the substrate to a cobalt precursor gas to form a sublayer of the cobalt capping layer during a vapor deposition process;

exposing the sublayer of the cobalt capping layer to a plasma during a post-treatment process; and repeating the vapor deposition process and the post-treatment process a plurality of times to deposit additional sublayers to form the cobalt capping layer.

2. The method of claim 1, further comprising chemically reducing copper oxides on the contaminated copper surface to form the metallic copper surface during the pre-treatment process.

3. The method of claim 1, wherein the contaminated copper surface is exposed to the reducing agent and an initial plasma during the pre-treatment process, the reducing agent comprises nitrogen ($N_2$), ammonia ($NH_3$), hydrogen ($H_2$), an ammonia/nitrogen mixture, or any combination thereof.

4. The method of claim 3, wherein the contaminated copper surface is exposed to the initial plasma for a time period of about 5 seconds to about 15 seconds.

5. The method of claim 1, wherein the reducing agent comprises hydrogen gas, the pre-treatment process is a thermal process, and the substrate is heated to a temperature of about 200° C. to about 400° C. during the thermal process.

6. The method of claim 1, further comprising depositing a dielectric layer on at least the cobalt capping layer, and wherein exposing the cobalt capping layer to a plasma during a post-treatment process prior to depositing the dielectric layer comprises exposing the cobalt capping layer to another reducing agent comprising nitrogen ($N_2$), ammonia ($NH_3$), hydrogen ($H_2$), an ammonia/nitrogen mixture, or any combination thereof.

7. The method of claim 1, wherein the cobalt capping layer has a thickness of about 4 Å to about 20 Å.

8. The method of claim 7, wherein the substrate is exposed to the cobalt precursor gas and hydrogen gas during an atomic layer deposition process.

9. The method of claim 1, wherein the cobalt precursor gas comprises a cobalt precursor, which has the general chemical formula $(CO)_xCo_yL_z$, wherein:

X is 1, 2, 3, 4, 5, 6, 7, 8, 9, 10, 11, or 12;

Y is 1, 2, 3, 4, or 5;

Z is 1, 2, 3, 4, 5, 6, 7, or 8; and

L is a ligand independently selected from the group consisting of cyclopentadienyl, alkylcyclopentadienyl, methylcyclopentadienyl, pentamethylcyclopentadienyl, pentadienyl, alkylpentadienyl, cyclobutadienyl, butadienyl, allyl, ethylene, propylene, alkenes, dialkenes, alkynes, nitrosyl, ammonia, derivatives thereof, and combinations thereof.

10. The method of claim 1, wherein the cobalt precursor gas comprises a cobalt precursor selected from the group consisting of tricarbonyl allyl cobalt, cyclopentadienyl cobalt bis(carbonyl), methylcyclopentadienyl cobalt bis(carbonyl), ethylcyclopentadienyl cobalt bis(carbonyl), pentamethylcyclopentadienyl cobalt bis(carbonyl), dicobalt octa (carbonyl), nitrosyl cobalt tris(carbonyl), bis(cyclopentadienyl) cobalt, (cyclopentadienyl) cobalt (cyclohexadienyl), cyclopentadienyl cobalt (1,3-hexadienyl), (cyclobutadienyl) cobalt (cyclopentadienyl), bis(methylcyclopentadienyl) cobalt, (cyclopentadienyl) cobalt (5-methylcyclopentadienyl), bis(ethylene) cobalt (pentamethylcyclopentadienyl), derivatives thereof, complexes thereof, plasmas thereof, and combinations thereof.

11. The method of claim 1, wherein the cobalt precursor comprises cyclopentadienyl cobalt bis(carbonyl).

12. The method of claim 1, further comprising depositing a dielectric layer on at least the dielectric surface, and wherein the metallic copper surface and the dielectric surface are coplanar.

13. A method for capping a copper surface on a substrate, comprising:

positioning a substrate within a processing chamber, wherein the substrate comprises a contaminated copper surface and a dielectric surface;

exposing the contaminated copper surface to a reducing agent while forming a metallic copper surface during a pre-treatment process; and depositing a cobalt capping material over the metallic copper surface while leaving exposed the dielectric surface during a deposition-treatment cycle, comprising:

exposing the substrate to a cobalt precursor gas to selectively form a first cobalt layer over the metallic copper surface while leaving exposed the dielectric surface;

exposing the first cobalt layer to a plasma comprising nitrogen ($N_2$), ammonia, an ammonia/nitrogen mixture, or hydrogen during a treatment process;

exposing the substrate to the cobalt precursor gas to selectively form a second cobalt layer on the first cobalt layer while leaving exposed the dielectric surface during; and exposing the second cobalt layer to the plasma during the treatment process.

14. The method of claim 13, further comprising:
depositing a dielectric layer on at least the cobalt capping layer; and
exposing the cobalt capping material to a second plasma during a post-treatment process prior to depositing the dielectric layer.

15. The method of claim 14, wherein exposing the cobalt capping material to the second plasma during the post-treatment process prior to depositing the dielectric layer comprises exposing the cobalt capping material to a reducing agent selected from the group consisting of nitrogen ($N_2$), ammonia ($NH_3$), hydrogen ($H_2$), an ammonia/nitrogen mixture, and combinations thereof.

16. The method of claim 13, further comprising exposing the substrate to the cobalt precursor gas to selectively form a third cobalt layer on the second cobalt layer while leaving exposed the dielectric surface and exposing the third cobalt layer to the plasma during the treatment process.

17. The method of claim 13, wherein the substrate is exposed to the cobalt precursor gas and hydrogen gas during an atomic layer deposition process.

18. The method of claim 13, wherein the contaminated copper surface is exposed to the reducing agent and another plasma during the pre-treatment process, the reducing agent comprises nitrogen ($N_2$), ammonia ($NH_3$), hydrogen ($H_2$), an ammonia/nitrogen mixture, or any combination thereof.

19. A method for capping a copper surface on a substrate, comprising:
positioning a substrate within a processing chamber, wherein the substrate comprises a contaminated copper surface and a dielectric surface;
exposing the contaminated copper surface to a reducing agent while chemically reducing copper oxides on the contaminated copper surface and forming a metallic copper surface during a pre-treatment process; and
selectively forming a cobalt capping layer on the metallic copper surface while leaving exposed the dielectric surface, comprising:
exposing the substrate to a cobalt precursor gas to form a sublayer of the cobalt capping layer during a vapor deposition process;
exposing the sublayer of the cobalt capping layer to a plasma during a post-treatment process; and
repeating the vapor deposition process and the post-treatment process a plurality of times to deposit additional sublayers to form the cobalt capping layer;
wherein the cobalt capping layer has an overall thickness of about 4 Å to about 20 Å.

20. The method of claim 19, wherein the cobalt precursor gas comprises a cobalt precursor, which has the general chemical formula $(CO)_xCo_yL_z$, wherein:
X is 1, 2, 3, 4, 5, 6, 7, 8, 9, 10, 11, or 12;
Y is 1, 2, 3, 4, or 5;
Z is 1, 2, 3, 4, 5, 6, 7, or 8; and
L is a ligand independently selected from the group consisting of cyclopentadienyl, alkylcyclopentadienyl, methylcyclopentadienyl, pentamethylcyclopentadienyl, pentadienyl, alkylpentadienyl, cyclobutadienyl, butadienyl, allyl, ethylene, propylene, alkenes, dialkenes, alkynes, nitrosyl, ammonia, derivatives thereof, and combinations thereof.

* * * * *